(12) United States Patent
Patterson et al.

(10) Patent No.: US 9,515,068 B1
(45) Date of Patent: Dec. 6, 2016

(54) MONOLITHIC INTEGRATION OF GAN AND INP COMPONENTS

(71) Applicant: HRL Laboratories, LLC, Malibu, CA (US)

(72) Inventors: Pamela R. Patterson, Los Angeles, CA (US); Keisuke Shinohara, Thousand Oaks, CA (US); Hasan Sharifi, Agoura Hills, CA (US); Wonill Ha, Thousand Oaks, CA (US); Tahir Hussain, Calabasas, CA (US); James Chingwei Li, Simi Valley, CA (US); Dana C. Wheeler, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 305 days.

(21) Appl. No.: 14/014,121

(22) Filed: Aug. 29, 2013

(51) Int. Cl.
*H01L 27/00* (2006.01)
*H01L 27/06* (2006.01)
*H01L 21/84* (2006.01)
*H01L 27/12* (2006.01)
*H01L 23/48* (2006.01)

(52) U.S. Cl.
CPC .......... *H01L 27/0688* (2013.01); *H01L 21/84* (2013.01); *H01L 23/481* (2013.01); *H01L 27/1203* (2013.01); *H01L 2224/32145* (2013.01); *H01L 2224/97* (2013.01)

(58) Field of Classification Search
CPC .. H01L 27/1203; H01L 21/84; H01L 2224/97; H01L 23/481; H01L 2224/32145
See application file for complete search history.

(56) References Cited

U.S. PATENT DOCUMENTS

| | | |
|---|---|---|
| 7,396,731 B1 | 7/2008 | Fields |
| 7,598,131 B1 | 10/2009 | Micovic et al. |
| 7,598,148 B1 | 10/2009 | Fields |
| 7,875,523 B1 | 1/2011 | Fields |
| 7,972,936 B1 | 7/2011 | Brewer et al. |
| 2004/0238842 A1 | 12/2004 | Nicovic et al. |
| 2005/0070077 A1* | 3/2005 | Guarini et al. ............... 438/479 |
| 2006/0097319 A1* | 5/2006 | Kim .................. H01L 21/28525 257/353 |
| 2006/0170046 A1* | 8/2006 | Hara ....................... H01L 21/84 257/347 |
| 2006/0214225 A1* | 9/2006 | Holt et al. .................... 257/347 |
| 2007/0269945 A1* | 11/2007 | Ieong et al. .................. 438/222 |
| 2008/0036065 A1* | 2/2008 | Brunnbauer .......... H01L 21/568 257/686 |
| 2008/0179678 A1* | 7/2008 | Dyer et al. .................... 257/351 |
| 2008/0206951 A1* | 8/2008 | Holt .................. H01L 21/76254 438/400 |
| 2010/0078727 A1* | 4/2010 | Min et al. ..................... 257/369 |

(Continued)

*Primary Examiner* — Ngan Ngo
(74) *Attorney, Agent, or Firm* — Ladas & Parry

(57) ABSTRACT

A compound semiconductor integrated circuit comprising a first substrate; a first electronic component formed on top of said first substrate; a layer of a first dielectric material formed on top of said first substrate and including said first electronic component, said layer of a first dielectric material comprising a recess exposing a first region of said first substrate; and a layer of a second dielectric material attached to said first substrate on top of said first region of said first substrate after manufacturing of said layer of a second dielectric material, said layer of a second material comprising a second electronic component.

10 Claims, 6 Drawing Sheets

(56) References Cited

U.S. PATENT DOCUMENTS

| | | | |
|---|---|---|---|
| 2010/0224876 A1* | 9/2010 | Zhu | H01L 21/76898 257/52 |
| 2011/0037161 A1* | 2/2011 | Andry | H01L 23/5384 257/692 |
| 2011/0089417 A1* | 4/2011 | Yamazaki | H01L 27/0688 257/43 |
| 2011/0114945 A1* | 5/2011 | Yamazaki | H01L 21/8221 257/43 |
| 2012/0217622 A1* | 8/2012 | Bedell et al. | 257/632 |
| 2012/0313227 A1* | 12/2012 | Or-Bach | H01L 23/552 257/659 |
| 2012/0319254 A1* | 12/2012 | Kikuchi | H01L 23/5389 257/659 |
| 2013/0049198 A1* | 2/2013 | Liao | H01L 21/78 257/738 |
| 2013/0119400 A1 | 5/2013 | Shinohara et al. | |
| 2013/0277676 A1* | 10/2013 | Yamazaki | H01L 29/78693 257/57 |
| 2013/0334533 A1* | 12/2013 | Yamazaki | H01L 29/786 257/57 |
| 2013/0337637 A1* | 12/2013 | Cheng et al. | 438/478 |
| 2014/0145272 A1* | 5/2014 | Or-Bach | H01L 27/0688 257/369 |
| 2015/0129872 A1* | 5/2015 | Yamazaki | H01L 29/24 257/43 |

* cited by examiner

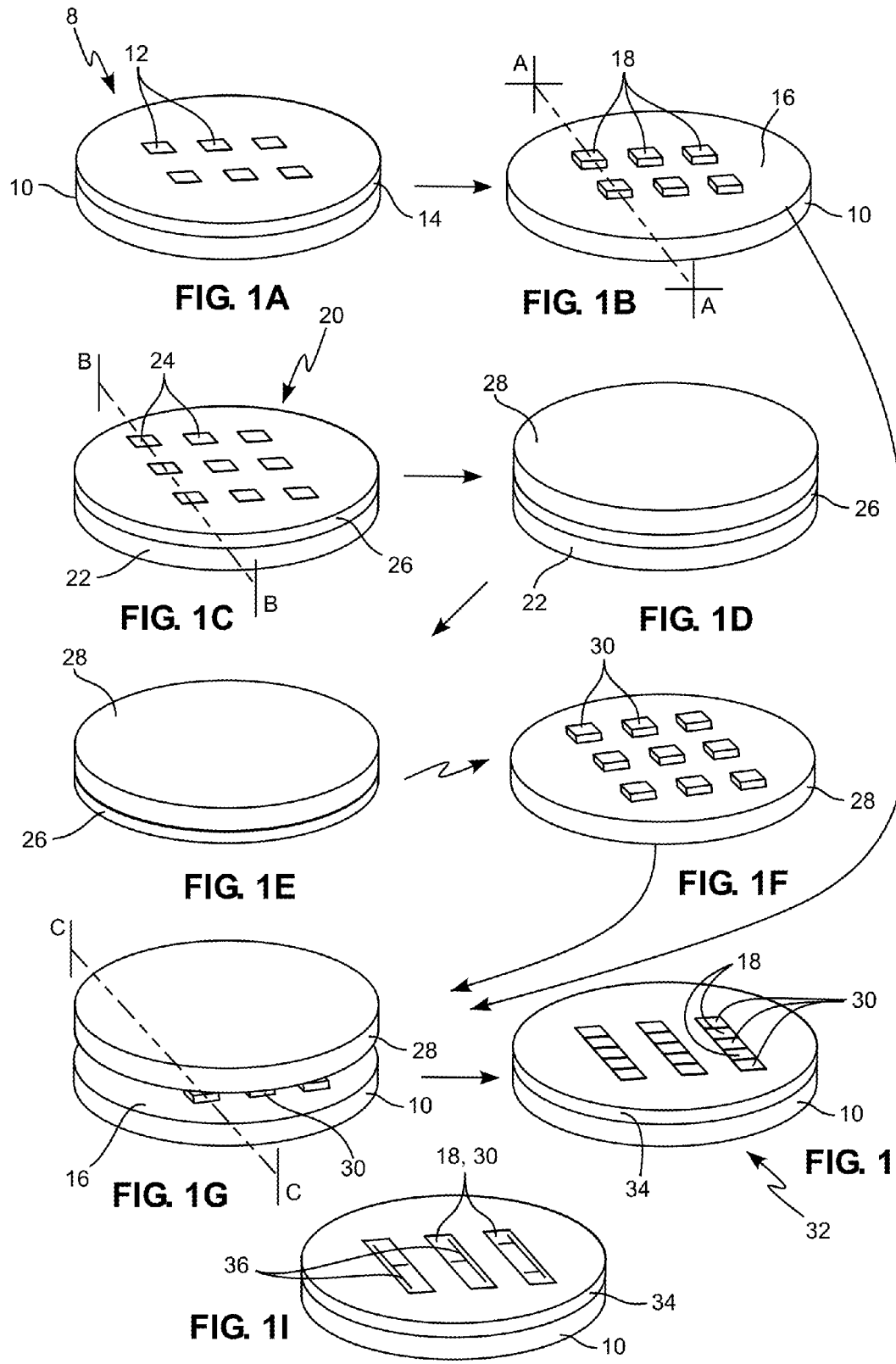

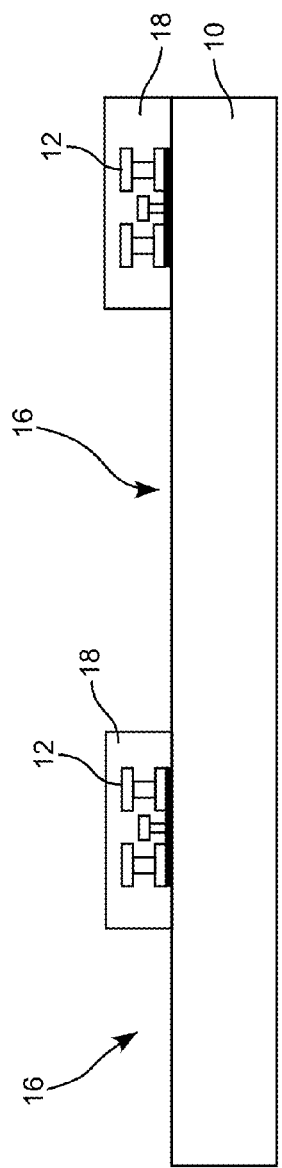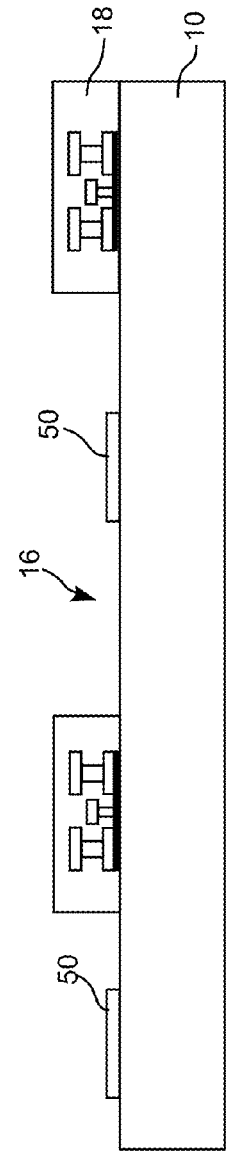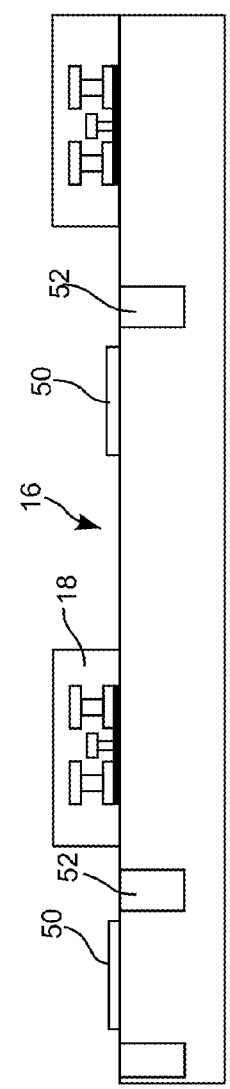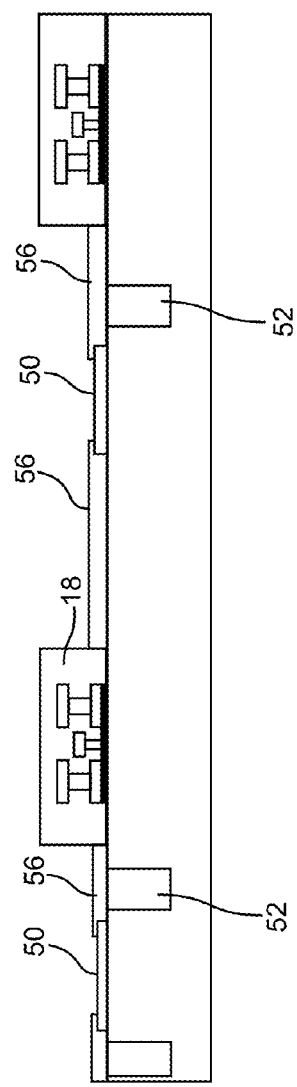

MONOLITHIC INTEGRATION OF GAN AND INP COMPONENTS

CROSS REFERENCE TO RELATED APPLICATIONS

This application does not relate legally to a previous application

TECHNICAL FIELD

This disclosure relates to compound semiconductor integrated circuits.

BACKGROUND

Monolithic integration of integrated components, for example of RF/mixed-signal integrated components, allows increasing functional diversity while decreasing the size weight and cost of the circuits. Heterogeneous integration of digital and non-digital functionalities into compact systems has a wide range of applications such as communication, automotive, environmental control, healthcare, security and entertainment.

U.S. Pat. No. 7,972,936, which is hereby incorporated by reference, discloses a heterogeneous integrated circuit and method of making the same. An integrated circuit includes a surrogate substrate including a material selected from the group consisting of Group II, Group III, Group IV, Group V, and Group VI materials and their combinations; at least one active semiconductor device including a material combination selected from the group consisting of Group IV-IV, Group III-V and Group II-VI materials; and at least one transferred semiconductor device including a material combination selected from the group consisting of Group IV-IV, Group III-V and Group II-VI materials. The at least one active semiconductor device and the at least one transferred device are interconnected.

What is needed are lower cost compound semiconductor integrated circuits and a method of fabricating the compound semiconductor integrated circuits that use conventional manufacturing methods to allow for mass production. Embodiments of the present disclosure answer these and other needs.

SUMMARY

An embodiment of the present disclosure relates to a compound semiconductor integrated circuit comprising: a first substrate; a first electronic component formed on top of said first substrate; a layer of a first dielectric material formed on top of said first substrate and including said first electronic component, said layer of a first dielectric material comprising a recess exposing a first region of said first substrate; and a layer of a second dielectric material attached to said first substrate on top of said first region of said first substrate after manufacturing of said layer of a second dielectric material, said layer of a second material comprising a second electronic component.

According to an embodiment of the present disclosure, said layer of a first dielectric material and said layer of a second dielectric material have a same thickness and are covered by a third dielectric material layer.

According to an embodiment of the present disclosure, the compound semiconductor integrated circuit comprises an upper electrical connection layer formed above at least portions of said layer of a first dielectric material and said layer of a second dielectric material; said upper electrical connection layer being coupled to the first and second electronic components.

According to an embodiment of the present disclosure, the compound semiconductor integrated circuit comprises at least one first metallic contact formed on top of at least a portion of said first region of said first substrate and at least one second metallic contact formed below at least a portion of said layer of a second material; said first and second metallic contacts being connected together.

According to an embodiment of the present disclosure, each of the first and second electronic components comprises a material combination selected from the group consisting of Group IV-IV, Group III-V and Group II-VI materials.

According to an embodiment of the present disclosure, the first electronic component comprises a device selected from the group consisting of a GaN device and an AlGaN device; and wherein the second electronic component comprises a device selected from the group consisting of an InGaAs device, an InAlAs device and an InP device.

According to an embodiment of the present disclosure, the first substrate comprises a material selected from the group consisting of Si, InP, GaAs, SiC, Al2O3, GaSb, AlN, InAs and diamond.

An embodiment of the present disclosure relates to a compound semiconductor integrated system comprising: a second substrate; a third electronic component formed in the second substrate; and a compound semiconductor integrated circuits as detailed above attached to said second substrate; at least one of the first and second electronic components being electrically coupled to the third electronic component.

According to an embodiment of the present disclosure, the compound semiconductor integrated system comprises: a dielectric layer formed on top of said third substrate; at least a third electrical conductor formed within said dielectric layer; said compound semiconductor integrated circuit being attached to said dielectric layer.

An embodiment of the present disclosure relates to a method of manufacture of a compound semiconductor integrated circuit; the method comprising: providing a first substrate; forming a first epitaxial layer on top of the first substrate; forming a first electronic component in said first epitaxial layer; removing said first epitaxial layer not part of said first electronic component; forming a layer of a first dielectric material on top of said first substrate and including said first electronic component; forming a recess in said layer of a first dielectric material that exposes a first region of said first substrate; providing a second substrate; forming a second epitaxial layer on top of the second substrate; forming a second electronic component in said second epitaxial layer; removing said second epitaxial layer not part of said second electronic component; forming a layer of a second dielectric material on top of said second substrate and including said second electronic component; attaching a handle on top of said layer of a second dielectric material; removing said second substrate; removing said second dielectric layer except around said second electronic component; attaching said layer of the second dielectric material around said second electronic component to said first substrate on top of said first region of said first substrate.

According to an embodiment of the present disclosure, said layer of a first dielectric material and said layer of a second dielectric material have a same thickness, the method further comprising forming a third dielectric material layer on top of said layer of a first dielectric material and said layer of a second dielectric material.

According to an embodiment of the present disclosure, the method further comprises forming an upper electrical connection above at least portions of said layer of a first dielectric material and said layer of a second dielectric material; said upper electrical connection layer being coupled to the first and second electronic components.

According to an embodiment of the present disclosure, the method further comprises: forming at least one first metallic contact on top of at least a portion of said first region of said first substrate; forming at least one second metallic contact below at least a portion of said layer of a second dielectric material; and connecting said first and second metallic contacts together.

According to an embodiment of the present disclosure, the method further comprises: providing a third substrate; forming a third electronic component in the third substrate; forming a compound semiconductor integrated circuit according to the methods detailed above; and attaching said compound semiconductor integrated circuit to said third substrate such that at least one of the first and second electronic components is electrically coupled to the third electronic component.

According to an embodiment of the present disclosure, said attaching said compound semiconductor integrated circuit to said third substrate comprises: forming a dielectric layer on top of said third substrate; and attaching the compound semiconductor integrated circuit to said dielectric layer.

According to an embodiment of the present disclosure, each of the first and second electronic components comprises a material combination selected from the group consisting of Group IV-IV, Group III-V and Group II-VI materials.

According to an embodiment of the present disclosure, the first electronic component comprises a device selected from the group consisting of a GaN device and an AlGaN device; and wherein the second electronic component comprises a device selected from the group consisting of an InGaAs device, an InAlAs device and an InP device.

According to an embodiment of the present disclosure, the first substrate comprises a material selected from the group consisting of Si, InP, GaAs, SiC, Al2O3, GaSb, AlN, InAs and diamond.

According to an embodiment of the present disclosure, the methods detailed above are such that: forming a compound semiconductor integrated circuit comprises forming a plurality of compound semiconductor integrated circuits; and attaching said compound semiconductor integrated circuit to said third substrate such that at least one of the first and second electronic components is electrically coupled to the third electronic component comprises attaching said plurality of compound semiconductor integrated circuits to said third substrate; and forming an upper electrical connection above said plurality of compound semiconductor integrated circuits; said upper electrical connection layer being coupled to said first, second and third electronic components.

According to an embodiment of the present disclosure, the third substrate is a Silicon wafer and the third electronic components are CMOS components.

BRIEF DESCRIPTION OF THE DRAWINGS

FIGS. 1A to 1I illustrate the manufacturing of a compound semiconductor integrated circuit according to an embodiment of the present disclosure.

FIGS. 3A to 3D illustrate the manufacturing of a first component of a compound semiconductor integrated circuit according to an embodiment of the present disclosure.

DETAILED DESCRIPTION

Figure 2A:
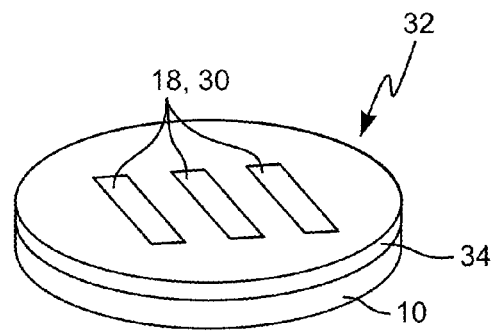
FIGS. 2A to 2D illustrate the manufacturing of a compound semiconductor integrated system according to an embodiment of the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

An overview of the manufacturing of a compound semiconductor integrated circuit according to an embodiment of the present disclosure is shown in FIGS. 1A to 1I.

FIG. 1A shows a first wafer 8, comprising a growth substrate 10 on top of which were formed first electronic components/devices 12 is fabricated using a first technology. According to an embodiment of the present disclosure, growth substrate 10 can be a SiC substrate and electronic components 12 can be individual GaN HEMT transistors. According to another embodiment of the present disclosure, growth substrate 10 can be a Si substrate and electronic components 12 can be individual GaN HEMT transistors. According to an embodiment of the present disclosure, components 12 can be fabricated using a first known manufacturing technology up to and including the first metal layer of this first known manufacturing technology. According to an embodiment of the present disclosure, a layer of dielectric material 14 is formed on top of growth substrate 10 and electronic components 12. The surface of dielectric material layer 14 can be planarized. According to an embodiment of the present disclosure, the GaN HEMT transistors can be manufactured using a technology such as described in US2013119400 (SELF-ALIGNED SIDEWALL GATE GaN HEMT; to Shinohara et al.), U.S. Pat. No. 7,598,131 (High power-low noise microwave GaN heterojunction field effect transistor; to Micovic et al.); US2004238842 (GaN DHFET; to Micovic et al.), which are hereby incorporated by reference.

According to an embodiment of the present disclosure, electronic component 12 can comprise a single active component such as a HEMT. However, according to other embodiments of the present disclosure, electronic component/device 12 can comprise one or more passive components, and/or one or more active components.

As shown in FIG. 1B, according to an embodiment of the present disclosure dielectric material layer 14 is removed, exposing a first region 16 of growth substrate 10 and forming at the top of substrate 10 first isolated regions 18 of the dielectric material layer 14 around first electronic component 12.

As shown in FIG. 1C, a second wafer 20 comprising a growth substrate 22 on top of which were formed second electronic components/devices 24 is fabricated using a second technology. According to an embodiment, growth substrate 22 can be a InP substrate and electronic components 24 can be individual InP HBT transistors. According to an embodiment of the present disclosure, components 24 can be fabricated using a second known manufacturing technology up to and including the first metal layer of this second known manufacturing technology. According to an embodiment of the present disclosure, a layer of dielectric material 26 is formed on top of growth substrate 22 and electronic components 24. The surface of dielectric material layer 26 can be planarized. According to an embodiment of the present disclosure, the InP HBT transistors can be manufactured using a technology such as described in U.S. Pat. No. 7,598,148 (Non-self-aligned heterojunction bipolar transistor and a method for preparing a non-self-aligned heterojunction bipolar transistor; to C. Fields), U.S. Pat. No. 7,396,731 (Method for preparing a non-self-aligned heterojunction bipolar transistor with a small emitter-to-base spacing; to C. Fields) or U.S. Pat. No. 7,875,523 (HBT with emitter electrode having planar side walls; to C. Fields), which are hereby incorporated by reference.

According to an embodiment of the present disclosure, electronic component 24 can comprise a single active component such as a HBT. However, according to other embodiments of the present disclosure, electronic component/device 24 can comprise one or more passive components, and/or one or more active components.

As shown in FIG. 1D, according to an embodiment of the present disclosure a handle wafer 28 is temporarily bonded on top of dielectric material layer 26, prior to removing the growth substrate 22 as shown in FIG. 1E.

According to an embodiment of the present disclosure, dielectric material layer 26 is removed except around said second electronic components 24, thus forming at the bottom of handle wafer 28 second isolated regions 30 of the dielectric material layer 26 around second electronic components 24 as shown in FIG. 1F.

As shown in FIG. 1G, according to an embodiment of the present disclosure, second isolated regions 30 are then attached to first region 16 of growth substrate 10 beside first isolated regions 18. Handle wafer 28 is then removed, forming a wafer 32 comprising growth substrate 10 having attached on its top surface the second isolated regions 30, beside the first isolated regions 18. As shown in FIG. 1H, according to an embodiment of the present disclosure, a third dielectric layer 34 can be formed on top of growth substrate 10 and regions 18 and 30. The surface of dielectric material layer 34 can be planarized. According to an embodiment of the present invention, regions 18 and 30 have substantially the same thickness; for example a thickness of 5 micrometer. According to an embodiment of the present disclosure, regions 18 and 30 have a thickness comprised between 2 and 50 micrometer.

As shown in FIG. 1I, according to an embodiment of the present disclosure, additional manufacturing steps can be conducted on wafer 32; for example one or more steps of manufacturing of additional metallization layers 36 for electrically coupling determined first electronic components 12 and second electronic components 24 in regions 18 and 30.

Figure 2B:
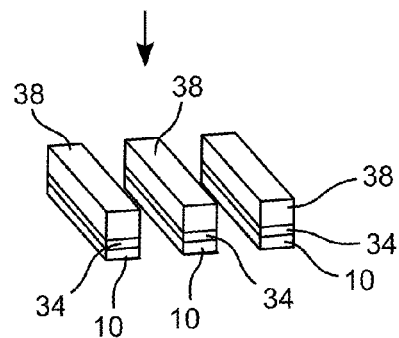
Figure 2C:
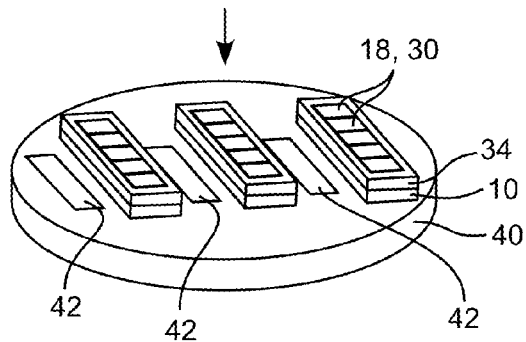

As illustrated in FIGS. 2A to 2D, according to another embodiment of the present disclosure a second handle wafer 38 can be attached to the top surface of third dielectric layer 34 shown in FIG. 2A, prior to thinning down growth substrate 10 to a desired thickness. According to an embodiment of the present disclosure, the second handle wafer 38, attached to the top surface of third dielectric layer 34 and the thinned down growth substrate 10 can then be diced as shown in FIG. 2B and attached to a third substrate 40 having third components 42 before removal of the portions of handle wafer 38, as shown in FIG. 2C. According to an embodiment of the present disclosure, third substrate 40 can be a Silicon wafer and third components 42 can be CMOS components. According to an embodiment of the present disclosure, third components 42 can be arranged on first substrate 40 such that they are located beside attached regions 18 and 30 and/or below attached regions 18 and 30.

Figure 2D:
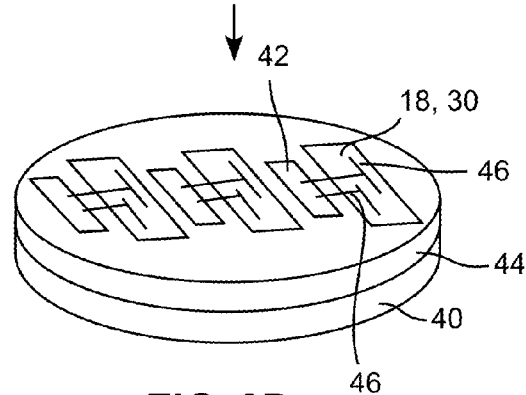

According to an embodiment of the present disclosure, a fourth dielectric layer 44 can be formed on top of third substrate 40, third components 42 and regions 18 and 30 as shown in FIG. 2D. The surface of dielectric material layer 44 can be planarized.

According to an embodiment of the present disclosure, additional manufacturing steps can be conducted on substrate 40; for example one or more steps of manufacturing of one or more additional metallization layers 46 for electrically coupling determined first, second and third electronic components 12, 24 and 42. Vias (not illustrated) can be formed where appropriate for electrically coupling metallization layers 46 to first, second and third electronic components 12, 24 and 42.

According to another embodiment of the present disclosure, instead of dicing the second handle wafer 38, attached to the top surface of third dielectric layer 34 and the thinned down growth substrate 10 and attaching the diced portions to third substrate 40 having third components 42, the thinned down growth substrate 10 and third dielectric layer 34 can be removed from the bottom of handle wafer 38 except around regions 18 and 30 around the first and second electronic components 12, 24. Handle wafer 38 is then aligned with third substrate 40 having third components 42 to attach regions 18 and 30, on top of corresponding portions of thinned down growth substrate 10, to appropriate regions of third substrate 40 beside third components 42. Handle wafer 38 is then removed and fourth dielectric layer 44 as well as additional metallization layers 46 are then formed.

FIG. 3A shows a portion of a cross section of wafer 8 along the line A-A illustrated in FIG. 1B, with two regions 18 of the dielectric material layer 14 formed around first electronic components 12 on top of growth substrate 10, exposing a region 16 at the top of growth substrate 10. According to an embodiment of the present disclosure, first electronic components 12 are made out of epitaxial layers grown on top of growth substrate 10. According to an embodiment of the present disclosure, the epitaxial layers grown on top of growth substrate 10 were removed after the manufacture of first electronic components 12, leaving only first electronic components 12 on top of growth substrate 10. According to an embodiment of the present disclosure, first electronic components 12 are only manufactured up to and including their first level of metallization before they are covered with dielectric material 14. As detailed previously, according to an embodiment of the present disclosure dielectric material is then removed from above region 16 of growth substrate 10, thus forming regions 18 of the dielectric material layer 14 around first electronic components 12.

FIG. 3B shows the cross section of FIG. 3A after metallic bonding pads 50 were formed on predetermined portions of region 16 of growth substrate 10, according to an embodiment of the present disclosure. According to an embodiment of the present disclosure, metallic bonding pads 50 are gold pads.

FIG. 3C shows the cross section of FIG. 3B after insulation trenches 52 were formed on predetermined portions of region 16 of growth substrate 10, according to an embodiment of the present disclosure. The depth of trenches 52 is such that it is slightly larger (for example by one or two micrometers) than the thickness to which the growth substrate 10 is to be subsequently thinned. According to an embodiment of the present disclosure, vias of the same depth as the trenches 52 can be formed in growth substrate 10 before or after forming metallic bonding pads 50, the vias being in electrical contact or not with said metallic bonding pads 50.

FIG. 3D shows the cross section of FIG. 3C after trenches 52 were filled with a dielectric material; and after a dielectric layer 56 was formed on top of region 16 and removed from above at least a portion of metallic bonding pads 50.

Figure 4A:
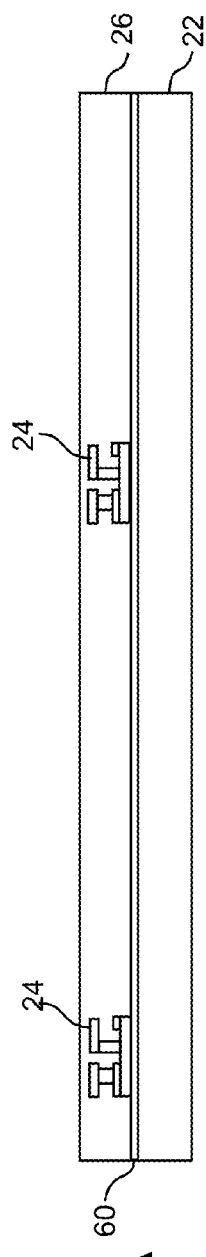
FIGS. 4A to 4D illustrate the manufacturing of a second component of a compound semiconductor integrated circuit according to an embodiment of the present disclosure.

FIG. 4A shows a portion of a cross section of wafer 22 along the line B-B illustrated in FIG. 1C, with dielectric material layer 26 formed around second electronic components 24 on top of growth substrate 22. According to an embodiment of the present disclosure, an etch stop layer 60 is formed on top of growth substrate 22 and second electronic components 24 are made out of epitaxial layers grown on top of etch stop layer 60. According to an embodiment of the present disclosure, the epitaxial layers grown on top of etch stop layer 60 were removed after the manufacture of second electronic components 24, leaving only second electronic components 24 on top of etch stop layer 60. According to an embodiment of the present disclosure, second electronic components 24 are only manufactured up to and including their first level of metallization.

Figure 4B:
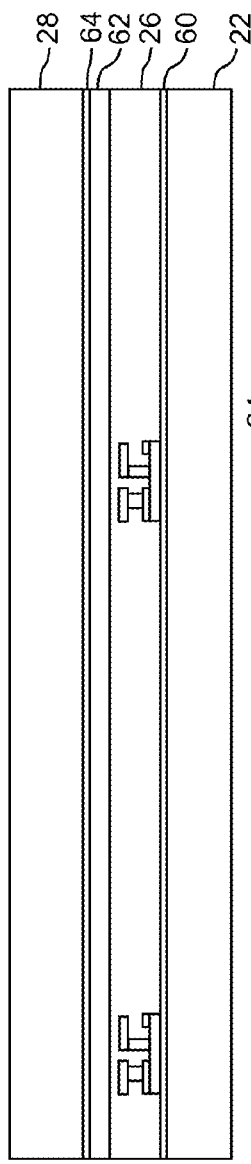

FIG. 4B shows the cross section of FIG. 4A after handle wafer 28 was temporarily attached to the top of dielectric material layer 26. According to an embodiment of the present disclosure, a further dielectric layer 62 was formed on top of dielectric material layer 26 and an etch stop layer 64 was formed on top of dielectric layer 62. Handle wafer 28 was temporarily attached to the top of etch stop layer 64.

Figure 4C:
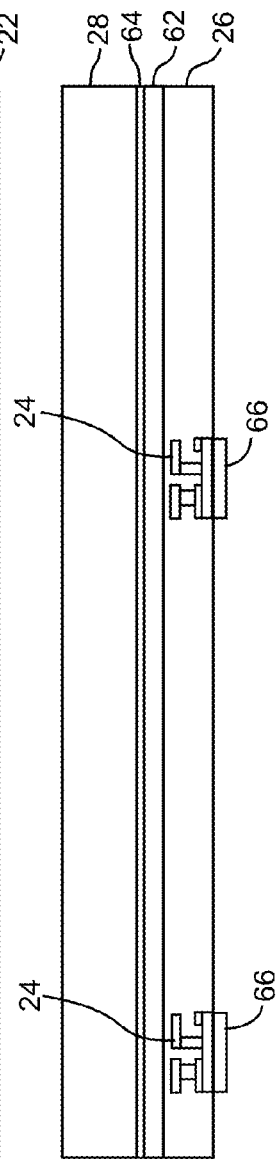

FIG. 4C shows the cross section of FIG. 4B after growth substrate 22 and etch stop layer 60 were removed so as to expose a bottom surface of dielectric layer 26 as well as a bottom surface of second components 24. According to an embodiment of the present disclosure, metallic bonding pads 66 were formed on at least a portion of the bottom surface of second components 24. According to an embodiment of the present disclosure where second components are InP DHBT, metallic bonding pads 66 are coupled to the collector of second components 24. According to an embodiment of the present disclosure, metallic bonding pads 66 are gold pads. According to an embodiment of the present disclosure, second components 24 and metallic bonding pads 66 are located with respect to handle wafer 28 such that a vertical alignment of handle wafer 28 with growth substrate 10 aligns vertically metallic bonding pads 66 with metallic bonding pads 50.

Figure 4D:
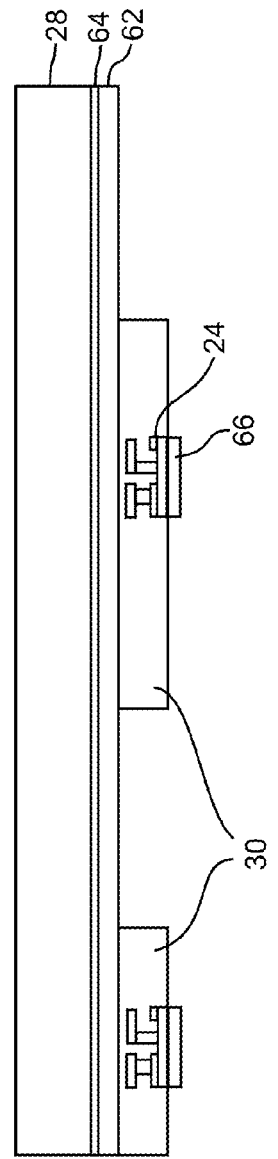

FIG. 4D shows the cross section of FIG. 4C after dielectric layer 26 was removed except around said second electronic components 24, thus forming at the bottom of handle wafer 28 second isolated regions 30 of the dielectric material layer 26 around the second electronic components 24.

Figure 5A:
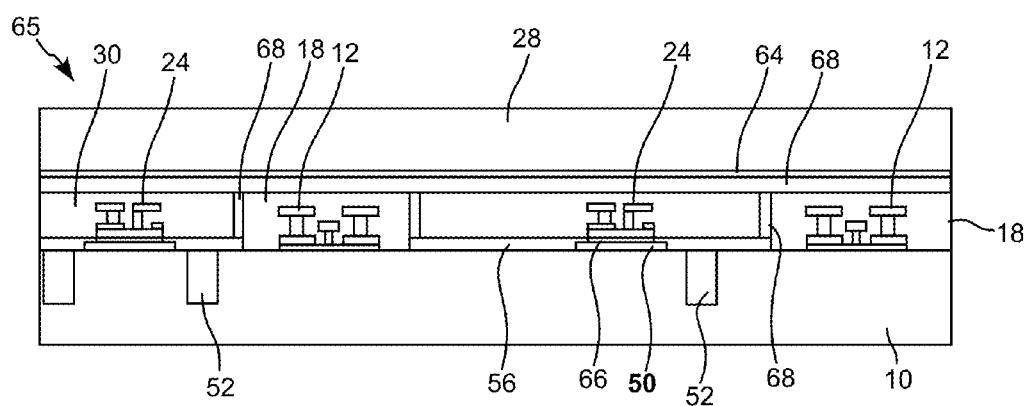
FIGS. 5A to 5B illustrate the manufacturing of a compound semiconductor integrated circuit using the first and second components of FIGS. 3 and 4.

FIG. 5A shows in cross-section an assembly 65 of the cross sections shown in FIGS. 3D and 4D, corresponding to a portion of a cross section of the assembly on substrate 10 along the line C-C illustrated in FIG. 1G. Assembly 65 forms a compound semiconductor integrated circuit according to an embodiment of the present disclosure. According to an embodiment of the present disclosure, handle wafer 28 was aligned with substrate 10 and metallic bonding pads 66 were bonded to metallic bonding pads 50 using a thermo-compression bonding process. According to an embodiment of the present disclosure, substrate 10 provides for evacuating the heat produced by electronic components 12 and/or 24. According to an embodiment of the present disclosure, a heat conducting or radiator structure (not shown) can be formed on, or connected to, substrate 10 for dissipating said heat from the electronic components either in the ambient or in a further structure (not shown) capable of evacuating heat. According to an embodiment of the present disclosure, first regions 18 and second regions 30 are arranged such that attaching metallic bonding pads 66 to metallic bonding pads 50 leaves gaps 68 between first regions 18 and second regions 30.

According to an embodiment of the present disclosure, metallic pads 50 and 66 can be replaced with adhesive for assembling regions 30 to substrate 10. Replacing the metallic pads with adhesive can impede heat conduction from components 24 to substrate 10 and require component 24 to be coupled to an alternative structure for evacuating heat, such as a metal via formed in of the final structure through region 30 and connecting an extended metallic pad 66.

Figure 5B:
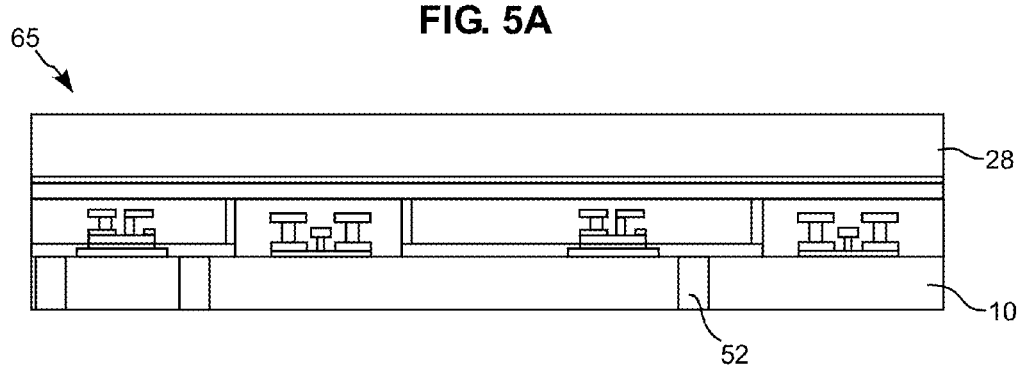

FIG. 5B shows assembly 65 after substrate 10 was thinned to a predetermined thickness. Thinning substrate 10 exposes a bottom surface of the dielectric in the insulating trenches 52. According to an embodiment of the present disclosure, the predetermined thickness to which substrate 10 is thinned is of 5 micrometer. According to an embodiment of the present disclosure, substrate 10 is thinned to a thickness comprised between 2 and 10 micrometer when substrate 10 comprises SiC. According to an embodiment of the present disclosure, substrate 10 is thinned to a thickness comprised between 2 and 100 micrometer when substrate 10 comprises Si. According to embodiments of the present disclosure, substrate 10 can be thinned using one of a lapping and grinding process; a Chemical and Mechanical Polishing process; a Ion Beam trimming process; a fine control Diamond Turning process; or any combination of the above processes.

According to embodiments of the present disclosure, where vias were formed in substrate 10, thinning substrate 10 exposes a bottom surface of the vias in the bottom surface of thinned substrate 10.

Figure 6:
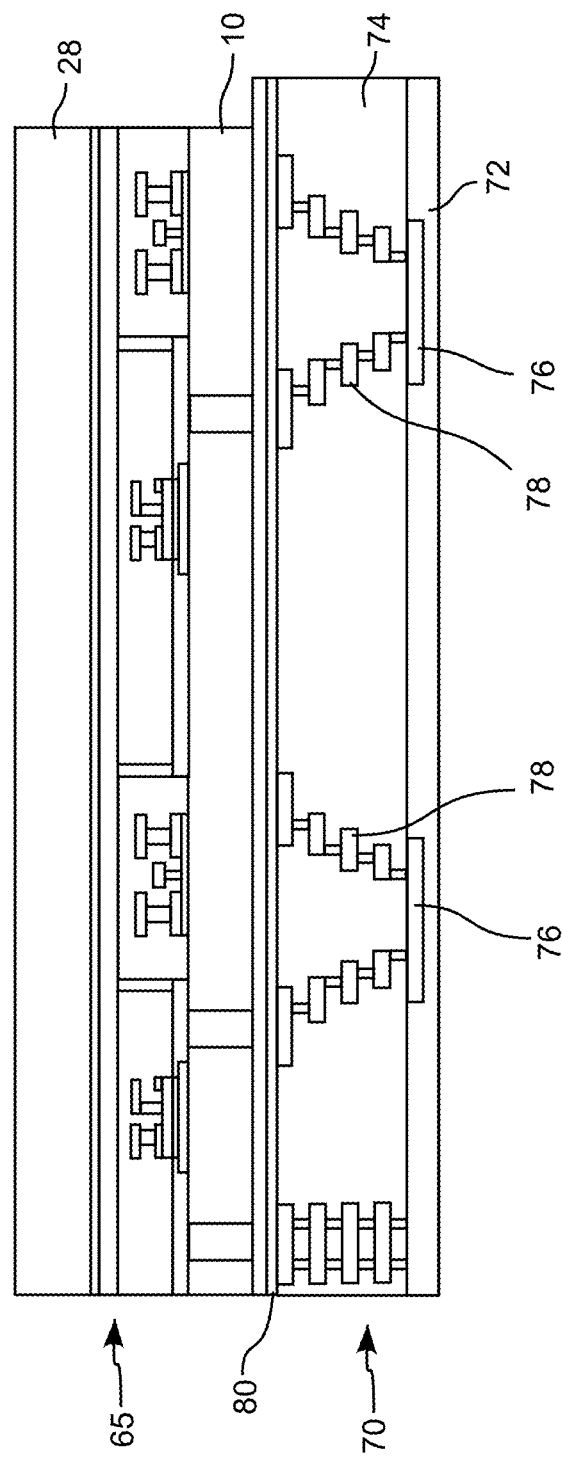
FIG. 6 illustrates a compound semiconductor integrated system according to an embodiment of the present disclosure.

FIG. 6 shows in cross section an integrated system comprising assembly 65 attached on top of a wafer 70. According to an embodiment of the present disclosure, wafer 70 comprises a substrate 72 the top surface of which comprises a dielectric layer 74.

According to an embodiment of the present disclosure, electronic components 76 are formed in substrate 72 prior to forming dielectric layer 74, and dielectric layer 74 can comprise electrical conductors and/or vias 78 coupled to electronic components 76. According to an embodiment of the present disclosure, if substrate 10 comprises a via exposed by the thinning of substrate 10, electrical conductors and/or vias 78 can be arranged so that they are coupled electrically to the via in substrate 10 when assembly 65 is attached to wafer 70.

According to an embodiment of the present disclosure, a passivation layer 80 can be formed where appropriate on top of dielectric layer 74. According to an embodiment of the present disclosure, substrate 72 can be a Silicon wafer and electronic components 76 can be CMOS components. According to an embodiment of the present disclosure, assembly 65 can comprise the complete substrate 10 or only a portion of it.

Where assembly 65 comprises only a portion of substrate 10, said portion of substrate 10 can be formed by dicing the assembly comprising substrate 10 and handle wafer 28 after regions 18 were attached on region 16 and substrate 10 was thinned, as detailed in relation with FIG. 5B. According to an embodiment of the present disclosure, a plurality of assemblies 65 comprising each only a portion of substrate 10 can be attached to wafer 70.

According to an embodiment of the present disclosure, after assembly 65 is attached to wafer 70, handle wafer 28 is removed, for example by etching or by release of a polymer layer. According to an embodiment of the present disclosure, layers 62 and 64 can also be removed, thus exposing gaps 68 between first regions 18 and second regions 30, before filling gaps 68 with a further dielectric layer and planarizing the surface of said further dielectric layer (shown as layer 44 in FIG. 2D).

According to an embodiment of the present disclosure, after planarizing the surface of said further dielectric layer, lithographic techniques can be used to build up additional patterned layers of metals and dielectrics on top of said further dielectric layer, such as metallization layer 46 shown in FIG. 2D.

According to an embodiment of the present disclosure, the additional patterned layers of metals and dielectrics can be used to connect together electronic components 12, 24 and 76 of the system. According to an embodiment of the present disclosure, the thickness of first and second regions 18, 30 on top of thinned substrate 10, is such that conventional fabrication techniques can be used for manufacturing the additional patterned layers of metals and dielectrics for electrically coupling the first, second and third electronic components 12, 24 and 42.

According to an embodiment of the present disclosure, regions 18, 30 and thinned substrate 10 that have an appropriate thinness allow forming vias having an aspect ratio that can be easily be manufactured using conventional processes. According to an embodiment of the present disclosure, conventional processes or fabrication techniques can be those used for fabricating the top metal layer of integrated circuits on a wafer such as wafer 70, for example the top metal layers of integrated CMOS circuits when wafer 70 is a Silicon CMOS circuit wafer. Appropriate thinness for a layer or substrate depends on the material of the layer or substrate, which determines for example the ease with which the material can be etched. Appropriate thinness for a SiC substrate is comprised between 2 and 10 micrometer, whereas appropriate thinness for a Si substrate is comprised between 2 and 100 micrometer.

According to an embodiment of the present disclosure, once the additional patterned layers of metals and dielectrics on top of the further dielectric layer are manufactured, the system comprising electronic components 12, 24 and 76 on top of wafer 70 can be diced into separate sub-systems.

According to an embodiment of the present disclosure, wafer 70 and growth supports 10, 22 can be of different size. For example, wafer 70 can be a 200 mm wafer whereas growth supports 10, 22 can be 75 or 100 mm wafers.

According to an embodiment of the present disclosure, each of the first and second electronic components 12, 24 comprises a material combination selected from the group consisting of Group IV-IV, Group III-V and Group II-VI materials.

According to an embodiment of the present disclosure, the first electronic component 12 comprises a device selected from the group consisting of a GaN device and an AlGaN device; and the second electronic component 24 comprises a device selected from the group consisting of an InGaAs device, an InAlAs device and an InP device.

According to an embodiment of the present disclosure, the growth substrate 10 comprises a material selected from the group consisting of Si, InP, GaAs, SiC, Al2O3, GaSb, AlN, InAs and diamond.

The above-described assembly of regions 30, which are attached to handle wafer 28, on substrate 10, beside regions 18, allows assembling the electronic components 24 with their upwardly manufactured surface turned upward, which makes electronic components 24 easy to design and manufacture compared to electronic components that are assembled with their upwardly manufactured surface turned downward.

The above-described assembly of regions 30, which are attached to handle wafer 28, on substrate 10, beside regions 18, allows assembling regions 30 of reduced size, such as comprising only an electronic component 24 such as a single transistor beside regions 18 of reduced size, such as comprising an electronic component 12 such as a single transistor. A reduced size of the regions 18 and 30 allows reducing the connection length between components 12 and 24, thus allowing a composite electronic circuit having a high integration rate.

The above-described assembly of regions 30 comprising electronic components 24, which are attached to handle wafer 28, on substrate 10, beside regions 18 comprising electronic components 12, allows proceeding after components 24 were tested, thus improving the reliability of the manufacturing process.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A compound semiconductor integrated circuit comprising:
   a first substrate;
   a first electronic component formed on top of said first substrate;
   a layer of a first dielectric material formed on top of said first substrate and including said first electronic component, said layer of a first dielectric material comprising a recess exposing a first region of said first substrate; at least one first metallic contact being formed in said recess on top of and in contact with at least a portion of said first region; and
   a layer of a second dielectric material attached to said first substrate on top of said first region of said first substrate after manufacturing of said layer of a second dielectric material, a second electronic component being at least partly included in said layer of a second dielectric material and at least a portion of said second dielectric material being arranged within said recess; at least one second metallic contact being formed below at least a portion of said layer of a second material; said first and second metallic contacts being formed separately and then connected together.

2. The compound semiconductor integrated circuit of claim 1, wherein said layer of a first dielectric material and said layer of a second dielectric material have a same thickness and are covered by a third dielectric material layer.

3. The compound semiconductor integrated circuit of claim 1, comprising an upper electrical connection layer formed above at least portions of said layer of a first dielectric material and said layer of a second dielectric material; said upper electrical connection layer being coupled to the first and second electronic components.

4. The compound semiconductor integrated circuit of claim 1, wherein each of the first and second electronic components comprises a material combination selected from the group consisting of Group IV-IV, Group III-V and Group II-VI materials.

5. The compound semiconductor integrated circuit of claim 4, wherein the first electronic component comprises a device selected from the group consisting of a GaN device and an AlGaN device; and wherein the second electronic component comprises a device selected from the group consisting of an InGaAs device, an InAlAs device and an InP device.

6. The compound semiconductor integrated circuit of claim 4, wherein the first substrate comprises a material selected from the group consisting of Si, InP, GaAs, SiC, Al2O3, GaSb, AlN, InAs and diamond.

7. A compound semiconductor integrated system comprising:
   a second substrate;
   a third electronic component formed in the second substrate; and
   a compound semiconductor integrated circuit as recited in claim 1 attached to said second substrate; at least one of the first and second electronic components being electrically coupled to the third electronic component.

8. The compound semiconductor integrated system of claim 7, comprising:
   a dielectric layer formed on top of said third substrate;
   at least a third electrical conductor formed within said dielectric layer;
   said compound semiconductor integrated circuit being attached to said dielectric layer.

9. The compound semiconductor integrated circuit of claim 1, wherein the second electronic component is embedded in the second dielectric material.

10. The compound semiconductor integrated circuit of claim 1, wherein said first metallic contact is bonded to said second metallic contact using a thermo-compression bonding process.

* * * * *